United States Patent [19]

Ohba et al.

[11] 4,443,818

[45] Apr. 17, 1984

[54] SOLID-STATE IMAGING DEVICE

[75] Inventors: Shinya Ohba, Kanagawa; Masaaki Nakai, Kodaira; Toshifumi Ozaki, Tokyo; Kenji Takahashi, Kodaira, all of Japan

[73] Assignee: Hitachi, Ltd., Tokyo, Japan

[21] Appl. No.: 329,609

[22] Filed: Dec. 10, 1981

[30] Foreign Application Priority Data

Dec. 12, 1980 [JP] Japan ................... 55-177605

[51] Int. Cl.³ .................. H04N 3/14; G11C 7/06
[52] U.S. Cl. ..................... 358/213; 307/444; 364/860
[58] Field of Search ............. 358/209, 212, 213, 41, 358/53; 357/24, 32; 307/279, 221 D; 250/211 J, 578; 364/862

[56] References Cited

U.S. PATENT DOCUMENTS

| | | | |
|---|---|---|---|
| 3,801,884 | 4/1974 | Sequin | 358/213 |
| 3,919,468 | 11/1975 | Weimer | 358/213 |
| 4,055,836 | 10/1977 | Weimer | 358/213 |
| 4,242,599 | 12/1980 | Suzuki | 358/213 |
| 4,335,405 | 6/1982 | Sakane | 358/213 |
| 4,349,743 | 9/1982 | Ohba | 250/578 |

OTHER PUBLICATIONS

A New Organization Area Image Sensor with CCD Readout Through Charge Priming Transfer, by Sumio Terakawa, et al., IEEE Electron Device Letters, vol. EDL-1, No. 5, May, 1980.

Primary Examiner—Tommy P. Chin
Attorney, Agent, or Firm—Antonelli, Terry & Wands

[57] ABSTRACT

A solid-state imaging device comprises an array of picture elements and a horizontal CTD shift register. In a horizontal blanking period, two or more sets of signals from vertical signal output lines coupled to the picture element array are stored in the horizontal CTD shift register. In a horizontal scanning period, the horizontal CTD shift register operates in a 3-phase (or 4-phase) driving fashion to deliver picture image information signal to its output part.

16 Claims, 9 Drawing Figures

SOLID-STATE IMAGING DEVICE

The present invention relates to a solid-state imaging device or area image sensor in which an array of photoelectric conversion elements are arranged in a matrix form at a photosensing part and a charge transfer device (hereinafter referred to simply as CTD) is used as a read-out shift register.

In the pending U.S. application Ser. No. 206,865 filed on Nov. 14, 1980 now U.S. Pat. No. 4,349,743, there has been proposed an example of an image sensor or solid-state imaging device in which an array of photodiodes are arranged in a matrix form at a photosensing part and CTDs are used as read-out shift registers, as is shown in FIG. 1.

Figure 1:
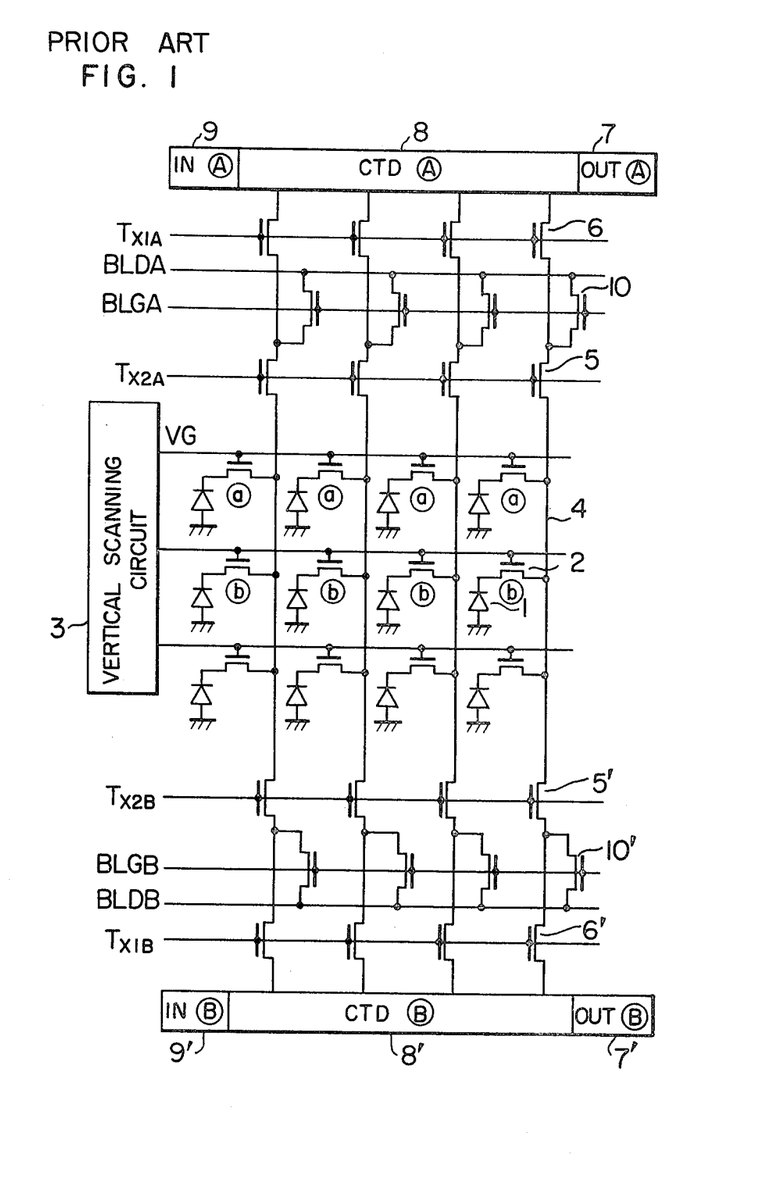
FIG. 1 is a circuit diagram showing an example of a prior art solid-state imaging device in which an array of photodiodes are used in a photosensing part and CTDs are used as read-out shift registers to which a certain embodiment of the present invention is applicable.

Referring to FIG. 1, reference numeral 1 designates photodiodes as photo-electric conversion elements, numeral 2 vertical switching MIS transistor gates, numeral 3 a vertical scanning circuit, numeral 4 vertical signal output lines, numerals 6 and 6' first transfer gates made of MIS transistors, numerals 5 and 5' second transfer gates made of MIS transistors, numerals 8 and 8' CTDs as read-out shift registers, numerals 7 and 7' output parts of the CTDs 8 and 8', numerals 9 and 9' input parts of the CTDs 8 and 8', and numerals 10 and 10' reset gates made of MIS transistors (antiblooming circuits). In many cases, the CTD 8 or 8' operates in a 2-phase driving fashion (using $H_1$ and $H_2$ clock pulses) or a quasi-4-phase driving fashion. Spurious signals resulting in blooming or vertical smear may be stored in the vertical signal output lines 4 during a horizontal scanning period. These spurious signals are swept out from a resetting voltage line BLDA through the second transfer gates 5 and the reset gates 10 at the initial stage of a horizontal blanking period. Subsequently, one horizontal row of the picture elements or photodiodes 1 designated by a in a first horizontal line are selected and the signals from these photodiodes are transferred to the A-channel CTD shift register 8 for storing in the respective memory or storage portions thereof. This operation is effected in a first or former half of the horizontal blanking period. Similarly, a second or later half of the horizontal blanking period is used so that the signals from the photodiodes 1 designated by b in a second horizontal picture element row or horizontal line are transferred to and stored in the B-channel CTD shift register 8'. In a horizontal scanning period, the first transfer gates 6 and 6' are turned off and the A- and B-channel CTDs 8 and 8' are driven so that signals transferred from the first and second picture element rows are simultaneously read out from the output parts 7 and 7' of the CTDs 8 and 8', respectively. This simultaneous signal read-out for the two horizontal lines or picture element rows is made to improve the resolution of a reproduced picture image when the image sensor is a single-chip color image sensor.

The operation of the image sensor shown in FIG. 1 will now be explained in detail by use of FIG. 2 which shows a timing chart of used driving pulses, mainly for the former half a horizontal blanking period.

In a horizontal scanning period, the CTD 8 (8') operates to transfer the respective signals to its output part 7 (7') and simultaneously, predetermined bias charges are successively transferred from the input part 9 (9'). Various methods may be considered for supplying the bias charges. As one method, the input terminal and input gate of the CTD may be biased to predetermined voltages. At the end of the horizontal scanning period, all the signals have been read out, and the predetermined quantities of bias charges or electrons in the case of BCD (bulk charge-transfer device) are existent in the respective stages of the CTD (see mode A in FIG. 2).

Figure 2:
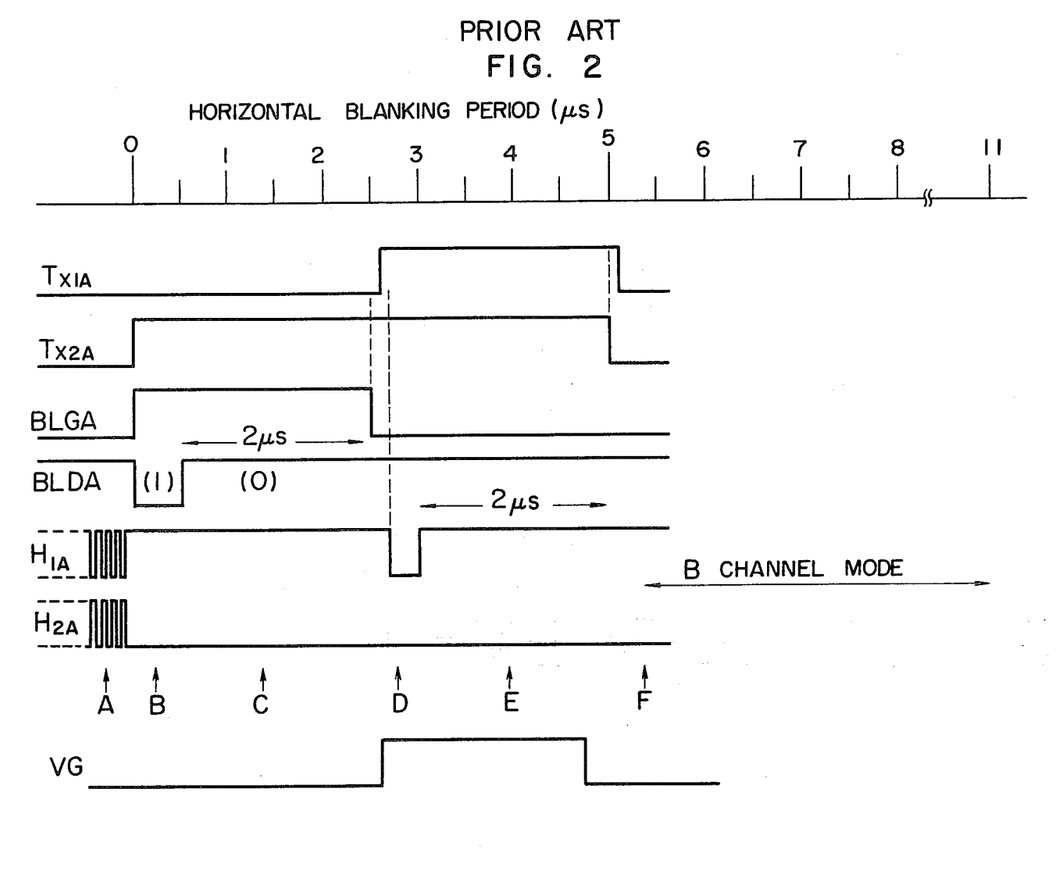
FIG. 2 shows a timing chart of driving pulses used in the device of FIG. 1.

When, at the initial stage of a horizontal blanking period, pulses $T_{X2A}$ and BLGA applied to the second transfer gate 5 and the reset gate 10 become "high" and the potential on the resetting voltage line BLDA becomes "low", charges (or electrons) flow from the resetting terminal BLDA into the vertical signal output line 4 (see mode B in FIG. 2). Thereafter, when BLDA is made "high", contrariwise the charges flow out from the vertical signal output line 4 to the resetting voltage line BLDA, and the vertical signal output line 4 is clamped to a potential $V_{VCA}$ given by the following expression (1), so that the outflow of the charges stops (see mode C in FIG. 2).

$$V_{VCA} = V_{X2A} - V_{thX2A} \tag{1}$$

where $V_{X2A}$ and $V_{thX2A}$ denote the "high" level of $T_{X2A}$ and the effective threshold voltage (including the substrate bias effect) of the second transfer gate 5, respectively.

Then, BLGA becomes "low", and BLGA and BLDA are not concerned in the subsequent operation. Next, when the transfer pulse $T_{X1A}$ applied to the first transfer gate 6 becomes "high" and $H_{1A}$ being the first clock pulse of the CTD 8 is made "low", the bias charges sent from the input part 9 of the CTD 8 are transferred to the respective vertical signal output lines 4 (see mode D in FIG. 2). The relationship of the respective potentials needs to be set in advance so that the charges may not shift to the adjacent electrodes of the CTD 8 when the clock pulse $H_{1A}$ becomes "low". Concretely, letting $V_{thCA}$, $V_{thX1A}$, $H_{2AL}$ and $V_{X1A}$ denote the threshold voltage of the channel of the CTD 8, the threshold voltage of the first transfer gate 6, the "low" level of the second clock pulse $H_{2A}$ of the CTD 8 and the "high" level of the transfer pulse $T_{X1A}$, respectively, the following relation may be held:

$$V_{X1A} - V_{thX1A} \geq H_{2AL} - V_{thCA} \tag{2}$$

At this time, when a certain vertical scanning line (corresponding to VG in FIG. 1) becomes "high", the signal charges (or electrons) of the photodiodes in the corresponding picture element row shift to the respective vertical signal output lines 4 and mix with the bias charges from the CTD 8.

Subsequently, when the first clock pulse $H_{1A}$ of the CTD 8 is made "high", the bias charges and the signal charges existent in the vertical signal output line 4 flow to the CTD 8 until the vertical signal output line 4 becomes $V_{VCA}$ in expression (1) (see mode E in FIG. 2).

When the transfer pulse $T_{X1A}$ is made "low", the vertical signal output line 4 and the CTD 8 are electrically disconnected. At this time, the CTD 8 stores therein the signal charges from the photodiode in addition to the bias charges having originally been existent (see mode F in FIG. 2).

In the above, the operation of putting the signals of the n-th picture element row into the A-channel CTD 8 has been described. In the second or later half of the identical horizontal blanking period, the same operation of transferring the signals of the (n+1)-th picture element row to the B-channel CTD 8' is carried out. Both the A- and B-channel CTDs 8 and 8' operate in the horizontal scanning period so that the signals of the two picture element rows are successively read out from the output parts 7 and 7' of the CTDs 8 and 8'.

The signal which is read out from the output part of the CTD is a mixed signal in which a bias signal and a video signal are superposed. The bias component which is D.C. component may be immediately removed by a known method. Alternatively, it may be included in the output signal as it is, and an appropriate processing, for example, the correction of a black level or white level voltage may be executed by a signal processing circuit in a succeeding stage. Accordingly, the bias component does not pose any special problem.

It is usual that the solid-state imaging device performs the so-called interlace-mode operation. Also in the image sensor shown in FIG. 1, various schemes of the interlace-mode operation may be considered. Now, an example thereof will be described. In one horizontal scanning period of a certain field (odd field), signals of the n-th picture element row are read out by the A-channel operation and signals of the (n+1)-th row by the B-channel operation, and in one horizontal scanning period of the next field (even field), signals of the (n+1)-th row are read out by the A-channel operation and signals of the (n+2)-th row by the B-channel operation. In this manner, the interlace-mode operation can be effected by the simultaneously-selected two-row method.

The essence of the described image sensor consists in the following two points:

(1) As bias charges, charges having been shifted by a CTD are utilized. The bias charges are once dumped into vertical signal output lines. Thereafter, mixed charges in which signal charges and the bias charges are mixed are put into the CTD. The mixed charges are transferred and delivered by the CTD.

(2) Before reading out signals, charges are put into the vertical signal output lines from a resetting voltage terminal through reset MOST gates, whereby the vertical signal output lines are cleared irrespective of the initial voltages thereof.

It is a matter of course that the image sensor can be utilized as a black-and-white sensor or a color sensor which is of three-chip or single-chip type. The CTD used may be a BCD (bulk charge-transfer device), CCD (charge coupled device) or BBD (bucket brigade device).

However, the image sensor shown in FIG. 1 and expained above involves the following problems:

(1) Since the two CTDs and the associated gates in the A- and B-channels must be driven, the number of pins required for chip(s) becomes large.

(2) In order to compensate the fluctuation in the threshold voltage of the second transfer gates 5 and 5', two sweeping operations, namely, the transferring of charges from the antiblooming or reset gates 10 and 10' to the vertical signal output lines 4 (see (I) in FIG. 2) and the sweeping-out of charges through the gates 10 and 10' into the exterior (see (O) in FIG. 2) are required. As a result, the time for transfer of desired signal charges to the CTD 8 or 8' must be shortened, thereby adversely affecting the sensitivity and resolution. In addition, since the gains of the CTD output parts or amplifiers 7 and 7' may have different values, the device is subjected to noise.

An object of the present invention is to provide an improved solid-state imaging device capable of obtaining a reproduced picture image of high resolution.

To that end, in the solid-state imaging device which comprises a photosensing part including a matrix of photo-electric conversion elements to form a plurality of vertically arranged horizontal rows of picture elements, according to the invention, two or more different sets of signals from the photosensing part are transferred into and read out from a CTD of one channel. The CTD may include a 3- or 4-phase driving CTD. The two or more sets of signals may include ones selected from a set of signals of one horizontal picture element row, a set of signals of the other horizontal picture element row, a set of noise signals; etc. For processing of noise signals, another CTD of a second channel may be used.

The present invention will be apparent from the following detailed description of embodiments thereof taken in conjunction with the accompanying drawings, in which:

Figure 3:
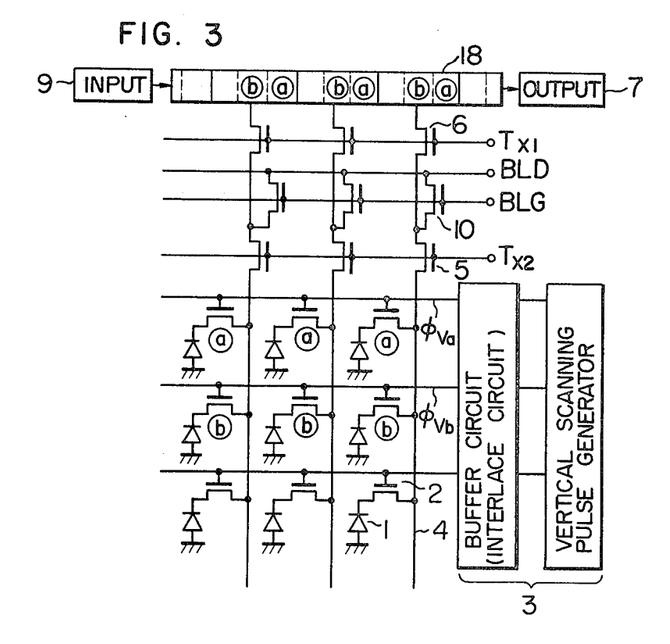
FIG. 3 shows a circuit diagram of a first embodiment of the solid-state imaging device according to the present invention.
Figure 4A:
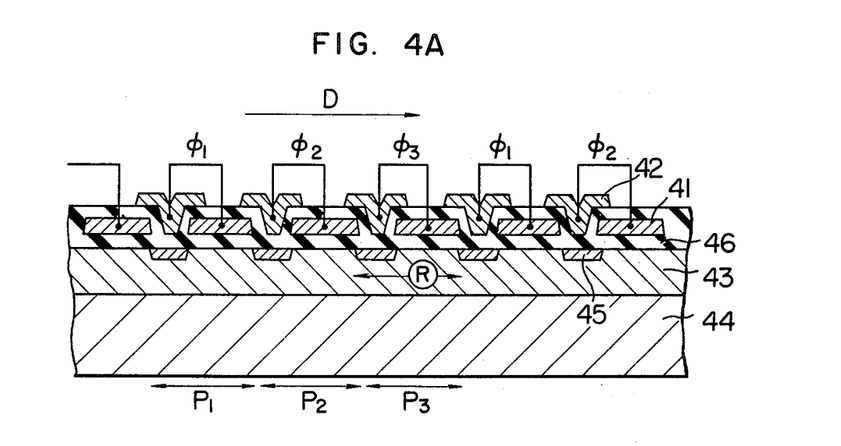
FIG. 4A shows in cross section the structure of a BCD which can be used in the device of FIG. 3.
Figure 4B:
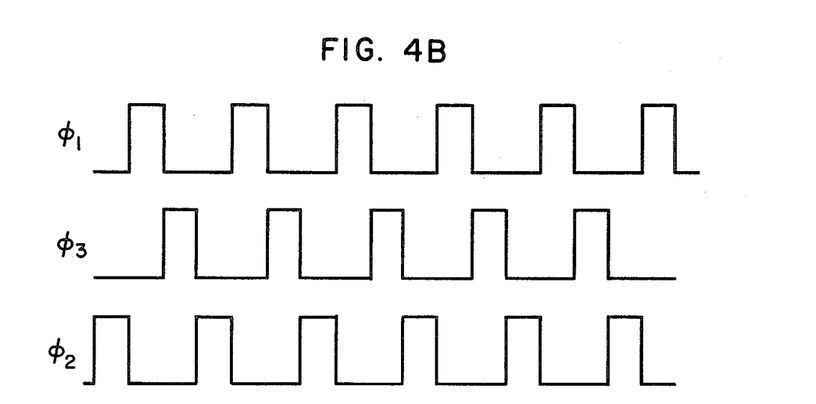
FIG. 4B shows a timing chart of 3-phase driving clock pulses used for the BCD of FIG. 4A.

Referring to FIG. 3 showing a first embodiment of the present invention applied to the device shown in FIG. 1, the present embodiment is characterized in that a CTD 8 as a read-out shift register is constructed by a 3-phase driving CTD such as a 3-phase driving BCD, as disclosed in U.S. Pat. No. 4,032,952, which has a cross-sectional structure shown in FIG. 4A. In FIG. 4A, reference numeral 41 designates first layer electrodes, numeral 42 second layer electrodes, numeral 46 an insulating film such as $SiO_2$, numeral 43 a semiconductor layer of a first conductivity type (for example, n-type Si; layer), numeral 44 a semiconductor substrate of a second conductivity type (for example, p-type Si substrate), and numeral 45 ion (for example, boron)-implanted layers of the second conductivity type formed in the layer 43 between the first layer electrodes 41. The operation of the shown CTD is featured by that adjacent ones of the first and second layer electrodes 41 and 42 are successively paired through interconnection therebetween and each pair is applied with one of three clock pulse trains $\phi_1$ to $\phi_3$ in 3-phase driving fashion which are shown in FIG. 4B. In other words, one stage of the CTD is constructed by first, second and third phase or storage regions $P_1$, $P_2$ and $P_3$. In the n-type Si layer 43, electrons being majority carries are transferred along the electrode chain. The potential within the channel 43 is uneven in, for example, an area shown by R in FIG. 4A and the direction D of transfer or shift of the majority carriers is determined by the application of the clock pulses.

The vertical signal output lines 4 shown in FIG. 3 are coupled through the gates 6 to those portions of the channel 43 in the first phase regions $P_1$ of the CTD shown in FIG. 4A, as is well known. Though not shown in FIG. 4A, the CTD structure has at the input part 9 an input terminal or port and an input gate for supplying predetermined bias charges and at the output part 7 an output gate, a reset gate a reset drain and an output transistor, as is well known.

Returning to FIG. 3, the 3-phase driving CTD shift register 18 can store information in locations corresponding to two of the three phase regions. Therefore, the CTD 18 stores a first set of signals ⓐ from the horizontal row of picture elements a and a second set of signals ⓑ from the horizontal row of picture elements b. The operation for a horizontal blanking period in the present embodiment includes the following sequential steps:

(1) At the initial stage of the horizontal blanking period, the vertical signal output lines 4 are cleared so that spurious charges which are not a correct signal are swept out through the reset gates 10 to a resetting voltage line or terminal BLD (like mode B of FIG. 2).

(2) Signal charges ⓐ of the horizontal row a picture elements a are transferred into the respective intermittent storage regions of the CTD 18 (like modes D and E of FIG. 2).

(3) The CTD 18 is shifted by one phase.

(4) Signal charges ⓑ of the horizontal row of picture elements b are transferred into the CTD 18 (like modes D and E of FIG. 2).

In a horizontal scanning period, the first and second transfer gates 6 and 5 whose gates are connected to transfer pulse lines or terminals $T_{X1}$ and $T_{X2}$, respectively are turned off to drive the CTD 18 so that signals are sequentially read out through the output part 7 of the CTD. The transfer of signal charges in the CTD in that case is effected by the repetition of (i) a first operation of shifting signal charges ⓐ to the next or right storage region storing no signal charges therein and (ii) a second operation of shifting signal charges ⓑ to the region which is now vacant by the shifting of signal charges ⓐ.

Figure 4C:
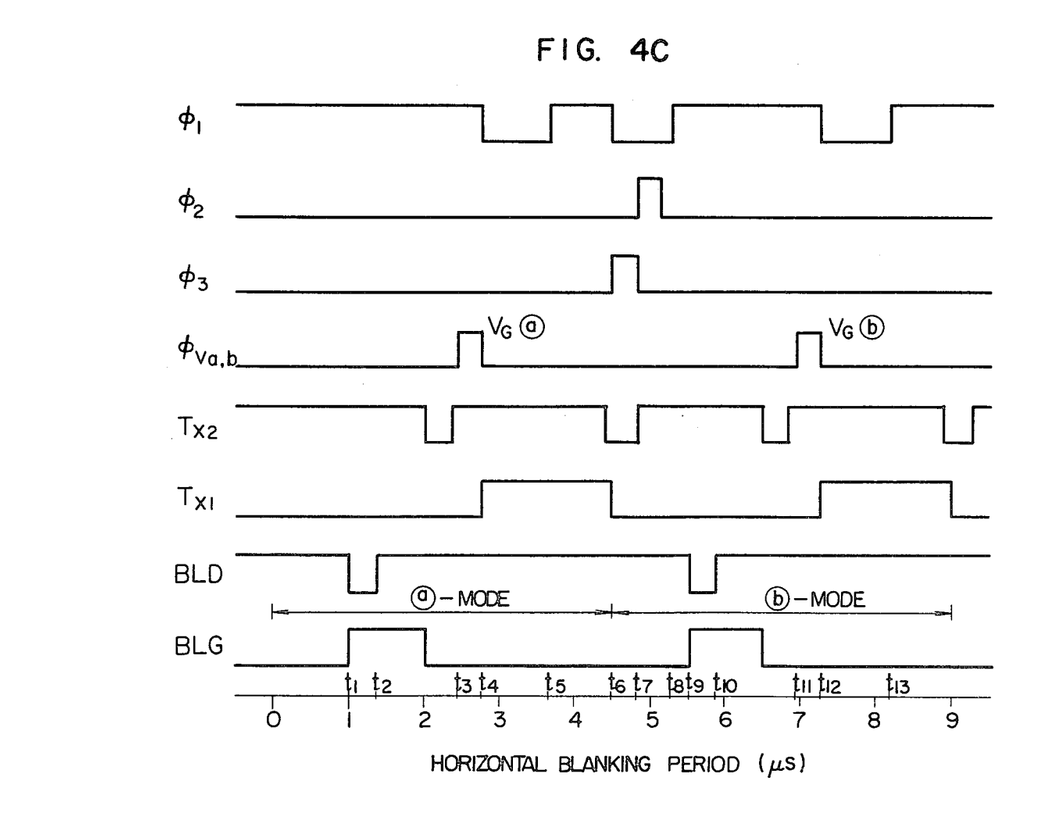
FIG. 4C shows a timing chart of driving pulses used in the device of FIG. 3.

The above operation of the device shown in FIG. 3 will not be explained in detail by use of FIG. 4C which illustrates a timing chart of used driving pulses for one horizontal blanking period. At time instant $t_1$ in the horizontal blanking period, the reset gates 10 are turned on so that bias charges are supplied from the resetting voltage line BLD to the vertical signal output lines 4 through the reset gates 10 and the second transfer gates 5. Thereafter, noise charges and the bias charges are swept from the vertical signal output lines 4 to the line BLD through the gates 5 and 10 at time instant $t_2$. At time instant $t_3$, a vertical scanning line $\phi_{Va}$ becomes "high" to turn the associated switching gates 2 on so that signal charges ⓐ of the horizontal row of picture elements a are coupled to the vertical signal output lines 4. At time instant $t_4$, the clock pulse signal $\phi_1$ becomes "low" and the first transfer gates 6 are turned on, so that predetermined bias charges sent from the input part 9 of the CTD 18 are transferred from the CTD 18 to the vertical signal output lines 4 through the first and second transfer gates 6 and 5. The signal charges a and the bias charges which are now existent on the vertical signal output lines 4 are taken or transferred into the associated storage regions $P_1$ of the CTD 18 at time instant $t_5$ when the clock pulse signal $\phi_1$ becomes "high". At time instant $t_6$, the clock pulse signals $\phi_1$ and $\phi_3$ become "low" and "high", respectively while the clock pulse signal $\phi_2$ is kept to be "low". As a result, the bias charges having been stored in the region $P_2$ of the CTD 18 are shifted into the region $P_3$. At time instant $t_7$, the clock pulse signals $\phi_2$ and $\phi_3$ become "high" and "low", respectively while the clock pulse signal $\phi_1$ is kept to be "low", so that the bias charges and the signal charges ⓐ having been stored in the region $P_1$ of the CTD 18 are shifted into the next adjacent region $P_2$. At time instant $t_8$, the clock pulse signals $\phi_1$ $\phi_2$ have "high" and "low" levels, respectively while the $\phi_3$ is kept to be "low". As a result, the bias charges having been stored in the region $P_3$ of the CTD 18 are shifted into the adjacent region $P_1$.

Steps (ⓑ -mode) similar to the foregoing ⓐ -mode are performed for signal charges ⓑ of the horizontal row of picture elements b, as is apparent from FIG. 4C. The steps at time instants $t_9$ to $t_{13}$ correspond to those at the time instants $t_1$ to $t_5$, respectively.

The clock pulse signal portion of the timing chart shown in FIG. 4C is followed in a horizontal scanning period by the clock pulse trains $\phi_1$ to $\phi_3$ shown in FIG. 4B. The shifting of signal charges ⓐ and ⓑ in the CTD 18 in the horizontal scanning period has already been explained. The implementation of circuits for supplying the driving pulses shown in FIG. 4C will be apparent from those skilled in the art.

With the above-described construction and operation, the embodiment shown in FIG. 3 can solve the problems explained in conjunction with FIG. 1, thereby providing remarkable improvement on the performance of the solid-state imaging device.

Figure 5:
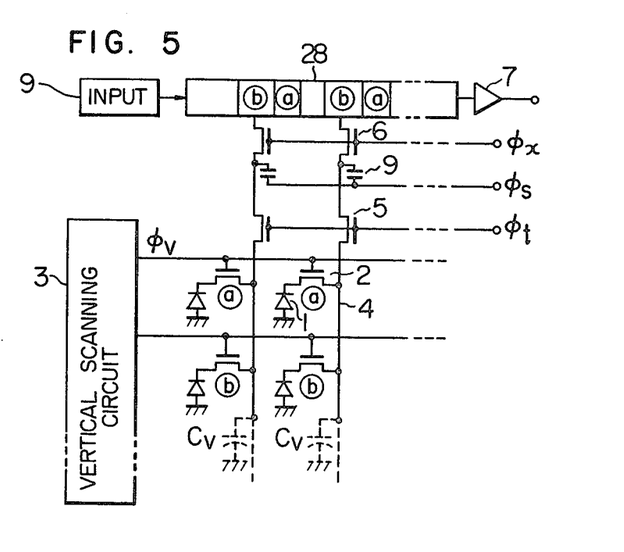
FIG. 5 shows a circuit diagram of a second embodiment of the solid-state imaging device according to the invention.

FIG. 5 shows a second embodiment of the present invention applied to a device other than the image sensor shown in FIG. 1. Namely, this embodiment is applied to the so-called charge priming transfer type of image sensor which is disclosed in the article by S. Terakawa et al reported in IEEE, Electron Device Letters, Vol. EDL-1, No. 5, May 1980, pages 86–88. Also in the present embodiment, the use of a 3-phase driving CTD shift register 28 allows the read-out of signals from two rows of picture elements a and b by one CTD, thereby providing a reproduced picture image of high resolution. In FIG. 5, numeral 9 designates storage capacitances, symbol $\phi_x$ a first transfer pulse line or terminal, symbol $\phi_s$ a resetting voltage line or terminal and symbol $\phi_t$ a second transfer pulse line or terminal.

The embodiments shown in FIGS. 3 and 5 have been explained in conjunction with the 3-phase driving CTD. However, the CTD can be constructed in a form of a 4-phase driving CTD which has a number of stages twice that of the number of picture elements in one horizontal picture element row or line, though the fabrication of such a CTD requires a process which is more precise as compared with the 3-phase driving CTD. It should be understood of course that CCD and BBD as well as BCD may be used as the CTD.

Figure 6:
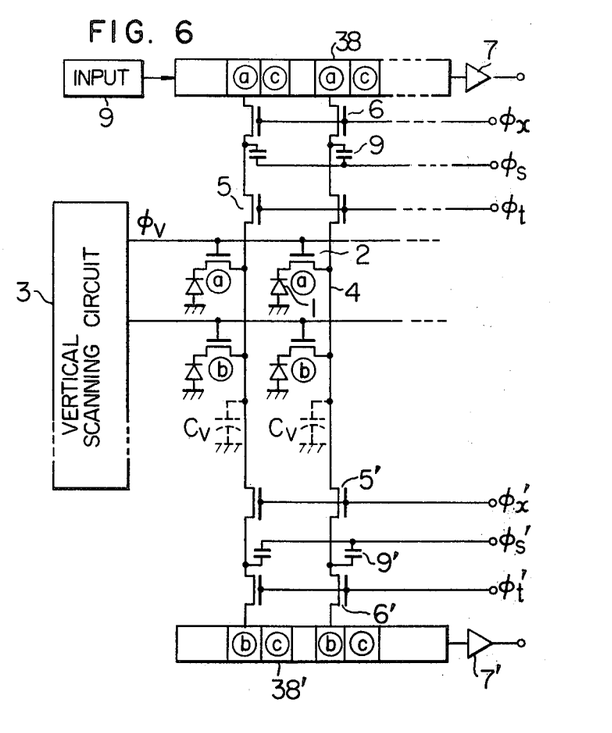
FIG. 6 shows a circuit diagram of a third embodiment of the solid-state imaging device according to the invention.

Referring to FIG. 6 which shows a third embodiment of the present invention, two 3-phase driving CTDs 38 and 38' are used. In this embodiment, noise charges ⓒ stored in stray capacitances $C_V$ are taken into both or either one of the CTDs 38 and 38' prior to the readout of signal charges ⓐ and ⓑ from the rows of picture elements a and b. With such a construction, signal charges ⓐ and ⓑ and noise charges ⓒ are read out and the subsequent signal processing permits to obtain a signal of ⓐ minus ⓒ and/or a signal of ⓑ minus ⓒ, thereby eliminating noise charges which may remain in the signal charges ⓐ and/or ⓑ.

Figure 7:
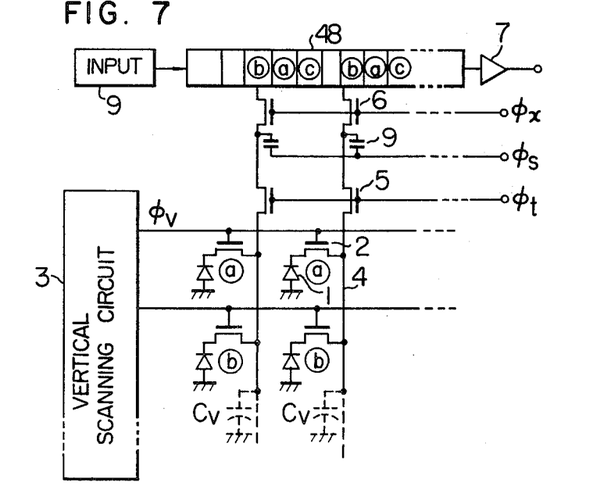
FIG. 7 shows a circuit diagram of a fourth embodiment of the solid-state imaging device according to the invention.

FIG. 7 shows a fourth embodiment of the present invention, in which only one 4-phase driving CTD 48 is used to read out signal charges ⓐ and ⓑ and noise charges ⓒ. This embodiment can provide a signal of ⓐ minus ⓒ and a signal of ⓑ minus ⓒ, like the embodiment shown in FIG. 6.

It should be understood of course that an interlace-mode operation can be employed in the devices shown in FIGS. 3, 5, 6 and 7. For example, in FIGS. 3 and 5, in a certain field (odd field), signals of the n-th and (n+1)-th picture element rows are read out from the CTD 18 (or 28), and in the next field (even field), signals of the (n+1)-th and (n+2)-th rows are read out from the CTD.

What is claimed is:

1. A solid-state imaging device comprising:
   a photosensing part including a matrix of photo-electric conversion elements to form a plurality of vertically arranged horizontal rows of picture elements;
   a CTD serving as a read-out shift register, said CTD having therein a plurality of storage regions;
   transfer means for transferring, a first set of signals from the picture elements in a first selected one of said horizontal picture element rows of said photosensing part and thereafter a second set of signals from the picture elements in a second selected horizontal picture element row of said photosensing part, into selected intermittent ones of said storage regions of said CTD during one horizontal blanking period;
   means for shifting each of the signals of said first set stored in the selected intermittent storage regions into the next adjacent storage regions, said second set of signals being transferred by said transfer means from said photosensing part into the selected intermittent storage regions which have been vacated by the shifting of said first set of signals; and
   means for reading both said first and second sets of signals in said CTD therefrom in one horizontal scanning period.

2. A solid-state imaging device according to Claim 1, wherein each of said picture elements includes a photo-electric conversion element and a switching gate for coupling a signal of the photo-electric conversion element onto a vertical signal output line coupled to said transfer means.

3. A solid-state imaging device according to claim 2, wherein said photo-electric conversion element is a photodiode and said switching gate is a MIS transistor.

4. A solid-state imaging device according to claim 2, wherein said transfer means includes first and second transfer gates between said vertical signal output line and said CTD, a reset gate being connected between a junction point of said first and second transfer gates and a resetting terminal.

5. A solid-state imaging device according to claim 2, wherein said transfer means includes first and second transfer gates between said vertical signal output line and said CTD, a storage capacitance being connected between a junction point of said first and second transfer gates and a resetting terminal.

6. A solid-state imaging device according to claim 2, 3, 4 or 5, wherein said CTD includes a 3-phase driving CTD which has three storage regions at each stage thereof.

7. A solid-state imaging device according to claim 2, 3, 4 or 5, wherein said CTD includes a 4-phase driving CTD which has the number of stages twice that of picture elements in one of said horizontal picture element rows.

8. A solid-state imaging device according to claim 1, wherein said CTD includes a 3-phase driving CTD which has three storage regions at each stage thereof.

9. A solid-state imaging device according to claim 8, wherein each of said picture elements includes a photodiode as the photo-electric conversion element and a vertical switching MIS transistor.

10. A solid-state imaging device according to claim 9, wherein said transfer means includes a vertical signal output line coupled to receive the output of said picture element and a transfer gate section connected between said vertical signal output line and said CTD.

11. A solid-stage imaging device according to claim 10, wherein said transfer gate section includes first and second transfer gates, a reset gate being connected between a junction point of said first and second transfer gates and a resetting terminal.

12. A solid-state imaging device according to claim 10, wherein said transfer gate section includes first and second transfer gates, a storage capacitance being connected between a junction point of said first and second transfer gates and a resetting terminal.

13. A solid-state imaging device according to claim 1, wherein each of said picture elements includes a photo-electric conversion element and a switching gate for coupling a signal of the photo-electric conversion element onto a vertical signal output line coupled to said transfer means, stray capacitances being incorporated in said vertical signal output lines, said transfer means transferring, during said one horizontal blanking period, noise signals stored in said stray capacitances into the selected intermittent storage regions prior to the transfer of said first and second sets of signals, said shifting means shifts each of said noise signals first stored in the selected intermittent storage regions into the next adjacent storage region prior to the shifting of said first set of signals, said first set of signals being transferred by said transfer means from said photo-sensing part into the selected storage regions which have been made vacated by the shifting of said noise signals, and said reading means reads out said noise signals, said first set of signals, and said second set of signals in said CTD in said one horizontal scanning period.

14. A solid-state imaging device according to claim 13, wherein said CTD includes a 4-phase driving CTD which has four storage regions at each stage thereof.

15. A solid-state imaging device comprising:
   a photosensing part including a matrix of photo-electric conversion elements to form a plurality of vertically arranged horizontal rows of picture elements, each of said picture elements having a photo-electric conversion element and a switching gate for coupling a signal of the photo-electric conversion element onto a vertical signal output line, stray capacitances being incorporated in said vertical signal output lines, said stray capacitances functioning to store noise signals;

first and second CTDs serving as read-out shift registers, respectively, each of said first and second CTDs including a 3-phase drive CTD, each CTD having a plurality of stages, each stage having three storage regions;

transfer means coupled to said vertical signal output lines for transferring the noise signals stored in said stray capacitances into a first one of the three storage regions of each stage of at least one of said first and second CTDs, thereafter for transferring signals from the picture elements in a first selected one of said horizontal picture element rows of said photosensing part into the first storage region of each stage of said first CTD and for transferring signals from the picture elements in a second selected horizontal picture element row of said photosensing part into the first storage region of each stage of said second CTD during one horizontal blanking period;

means for shifting each of said noise signals first stored in the respective first storage regions of the stages of said at least one CTD into a second storage region at the same stage, and for transferring at least one of said first and second signals being transferred by said transfer means from said photosensing part into the respective first storage regions which have been vacated by the shifting of said noise signals; and means for reading said noise signals, said first signals and said second signals in said first and second CTDs therefrom in one horizontal scanning period.

16. A solid-state imaging device according to claim 15, wherein said transfer means transfers said noise signals into both said first and second CTDs.

* * * * *